United States Patent [19]

Broyde

[11] 3,894,163

[45] July 8, 1975

[54] ADDITIVES TO NEGATIVE PHOTORESISTS WHICH INCREASE THE SENSITIVITY THEREOF

[75] Inventor: Barret Broyde, Decatur, Ga.

[73] Assignee: Western Electric Company, Incorporated, New York, N.Y.

[22] Filed: Mar. 26, 1973

[21] Appl. No.: 344,796

Related U.S. Application Data

[60] Continuation-in-part of Ser. No. 122,121, March 8, 1971, abandoned, which is a division of Ser. No. 764,866, Oct. 3, 1968, abandoned.

[52] U.S. Cl. .................... 427/43; 96/35.1; 96/36.2; 204/159.23; 427/273

[51] Int. Cl.² .................... B44D 1/50; C08F 236/08

[58] Field of Search .................... 117/93.31, 162, 8; 96/115 R, 35.1, 36.2; 250/492; 204/159.23, 159.2

[56] References Cited

UNITED STATES PATENTS

| | | | |
|---|---|---|---|
| 2,670,285 | 2/1954 | Minsk et al. | 96/115 R |
| 2,670,286 | 2/1954 | Minsk et al. | 96/115 R |
| 2,670,287 | 2/1954 | Minsk et al. | 96/115 R |
| 2,921,006 | 1/1960 | Schmitz et al. | 117/93.31 |
| 2,997,391 | 8/1961 | Murray et al. | 96/115 R |
| 3,100,702 | 8/1963 | Rauner et al. | 96/115 R |
| 3,458,313 | 7/1969 | Webb | 96/48 |
| 3,499,781 | 3/1970 | Krueckel | 117/93.31 |
| 3,529,960 | 9/1970 | Sloan | 96/115 R |
| 3,594,243 | 7/1971 | Deutsch et al. | 96/35.1 |
| 3,661,614 | 5/1972 | Bassemir et al. | 117/93.31 |

OTHER PUBLICATIONS

Thornley et al., J. Electrochemical Soc., Vol. 112, No. 11, Nov. 1965, pp. 1151–1153.

Kosar, Light–Sensitive Systems, pp. 140–147 and 160–167, 1967.

Roberton et al., J. App. Poly. Sci., Vol. II, No. 6, 1959, pp. 308–311.

*Primary Examiner*—William D. Martin

*Assistant Examiner*—John H. Newsome

*Attorney, Agent, or Firm*—J. Rosenstock

[57] ABSTRACT

The use of a scanning electron beam to generate a pattern in a negative photoresist is known. Electron beam equipment can be made which is capable of scanning very quickly, but a standard negative photoresist such as partially cyclized cis-polyisoprene requires such a large flux of electrons for proper exposure that the scanning equipment must be operated at speeds substantially slower than the capability of the equipment. By adding 1,4-diphenyl-1,3-butadiene which dissociates readily into free radicals to the photoresist, the sensitivity or speed of the photoresist is effectively increased. As a result, the electron beam can scan at a higher rate.

2 Claims, 3 Drawing Figures

ADDITIVES TO NEGATIVE PHOTORESISTS WHICH INCREASE THE SENSITIVITY THEREOF

CROSS REFERENCE TO RELATED APPLICATION

Figure 1:
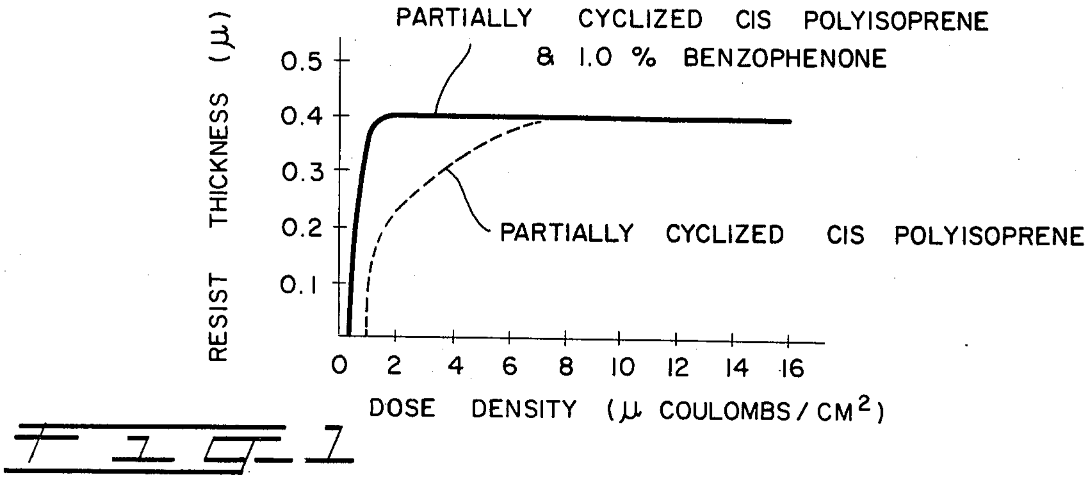

This is a continuation-in-part of my copending application, Ser. No. 122,121, filed Mar. 8, 1971, said application being a division of my application Ser. No. 764,866, filed Oct. 3, 1968 both now abandoned. Said copending application is assigned to the same assigned as the instant application.

BACKGROUND OF THE INVENTION

1. Field of the Invention

This invention relates generally to additives to negative photoresists which increase the sensitivity thereof and, more particularly, the invention relates to additives to standard negative photoresists which result in increased reactivity of the photoresist. The invention has particular application in, but is not limited to, the generation of microminiature circuit patterns by electron beam exposure of negative photoresists.

A negative photoresist is an organic material which, when exposed to radiation, undergoes chemical reactions of the type referred to as crosslinking, which reactions result in insolubilizing the exposed photoresist. The crosslinking reactions are of the type that can be initiated either by light or by electrons. Because it is possible to generate electron beams of substantial energy but only 0.1 $\mu$ or smaller diameter, their use in the generation of extremely small circuit patterns is preferred to the use of light. Electron beams also have a much better resolution capability than is possible when using an optical mask and light exposure, and they have a much greater depth of focus. The exposure of a conventional positive photoresist involves solubilization of the exposed areas, and the chemical reactions involved are of the scission or degradation type, which also require absorption of light or electrons. Because this type of photoresist requires higher flux densities for proper exposure than negative photoresists require, electron beams are not widely employed in this service. Materials that have been successfully used as electron-sensitive positive photoresists are discussed by Haller et al., IBM Journal, May 1968, pp. 251–256.

The most common negative photoresist in current use are Kodak Photoresist (KPR, KPR2, KPR3, trademarked products of Eastman Kodak Company) and Kodak Thin Film Resist (KTFR, trademark product of Eastman Kodak Company). The KPR composition is based on the dimerization of polyvinyl cinnamate, while KTFR is based on the crosslinking of a polymerized isoprene dimer, i.e., partially cyclized cis-polyisoprene, averaging one double bond per 10 carbon atoms. Another member of the KPR group besides KPR 2 and 3, is KOR (trademark for Kodak Ortho Resist). Another product, KMER (trademark for Kodak Metal Etch Resist) belongs to the KTFR group. The invention will be described with primary reference to use of polyvinyl cinnamate and partially cyclized cis-polyisoprene, but it will be appreciated that it is not so limited.

The crosslinking and insolubilization of resists is a complex phenomenon, but is believed to be describable, broadly, as follows. A polyvinyl cinnamate or KPR-type resist has the following general formula:

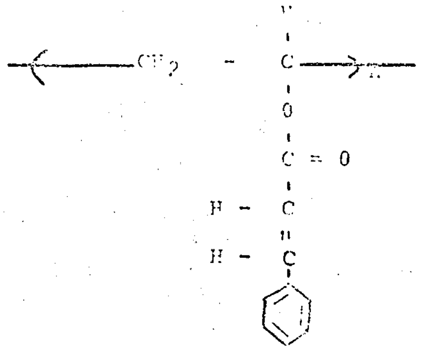

(1)

The number average molecular weight (N.A.M.W.) is 180,000–230,000, and the weight average molecular weight (W.A.M.W.) is 315,000–350,000. Upon exposure to light or electron energy, a diradical is formed:

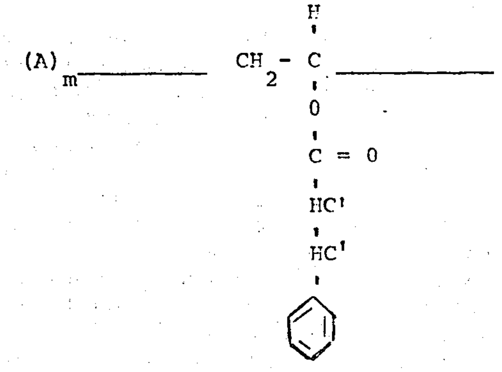

(2)

where A is the vinyl cinnamate monomer (structure 1 where $n = 1$). The diradical then reacts with another diradical to form a four-member ring:

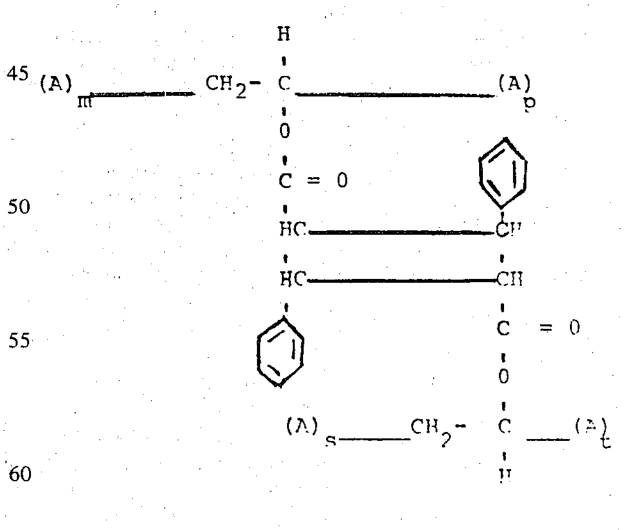

Further excitation and dimerization leads to an insoluble product; no free radicals participate in these reactions.

The partially cyclized cis-polyisoprene or KTFR-type resists can be characterized as follows:

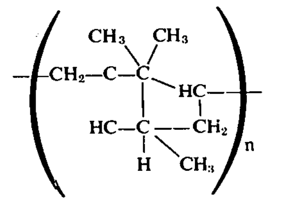

(4)

These materials (averaging one double bond per 10 carbon atoms) have a N.A.M.W. of 65,000±5,000 and a W.A.M.W. of about 120,000, and are insolubilized by free radical reactions. Thus, radiation produces a diradical:

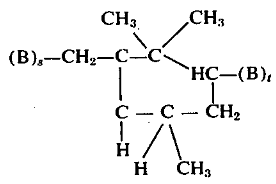

(5)

where B is the monomer of (4). The diradical reacts with other molecules until the free radical terminates. For good resolution, additives may be incorporated to keep the chain short. In all of the above structural formulae, the subscripts ($n$, $m$, $p$, $s$, $t$) refer to integers which are determinative of molecular weight. While polyvinyl cinnamate and partially cyclized cis-polyiosprene are insolubilized by different mechanisms, both result in crosslinked systems.

The procedures for generating a microminiature pattern circuit by electron bombardment of a photoresist are well established, and are summarized briefly below. The substrate is typically an oxidized silicon wafer or a chromium-coated glass plate. The photoresist is dissolved in a suitable solvent and applied to the substrate, which may then be spun at a high speed to leave an even film of the photoresist, having a controlled thickness, on the substrate surface. Alternatively, the photoresist-solvent solution may be sprayed on. In either case, most of the solvent evaporates immediately. The photoresist-coated substrate is then dried or baked briefly to drive off any remaining solvent and to improve adhesion. The coated substrate is then placed in a vacuum chamber and, when the vacuum has been established, it is radiated in the desired pattern and with an appropriate dosage. The coated and radiated substrate is then placed in a developer, which is a solvent for the soluble portion of the resist, to dissolve and remove the unexposed portions. It is again dried or baked. The desired pattern area on the substrate is now free of any covering film, and etching, plating or oxidizing follows. After this step, the remaining resist is stripped off.

There are a variety of limitations imposed upon the radiation step, but these are fully covered in the prior art (listed below) and need only be summarized here.

Briefly, the amount of radiation must fully expose the photoresist all the way down to the substrate, or else the developed photoresist will float off when the underlying undeveloped photoresist is dissolved in the developer. On the other hand, too much radiation will cause stripping problems and even polymer degradation. The amount of radiation necessary to form an insoluble photoresist is a function of the molecular weight of the material, and the gross amount of radiation. The efficiency of the crosslinking reactions is related to the accelerating potential of the electrons, penetration range (also a function of potential) and other factors. For instance, it has been determined that the maximum film thickness that can be developed by 5 KV electrons is about 6,500A, and by 10 KV electrons is about 2$\mu$. On the other hand, photoresists should initially be at least 6,000A thick to avoid pinhole problems (a 6,000A film will shrink to about 4,000A when developed). Other limitations which must be considered are electron scatter within the film and back-scatter from the substrate, though these are of a lesser order.

2. Discussion of the Prior Art

Prior workers have carried out extensive studies on the foregoing limitations, particularly with respect to the sensitivity and resolution capability of standard resists. This work need not be described herein, but is referenced below for background information:

Thornley et al., "Electron Beam Exposure of Photoresists," *Journal of the Electrochemical Society*, Vol. 112, No. 11, November 1965, pp. 1151-1153;

Broers, "Combined Electron and Ion Beam Process for Microelectronics,"" *Microelectronics and Reliability*, Vol. 4, 1965, pp. 103–104;

Kanaya et al., "Measurement of Spot Size and Current Density Distribution of Electron Probes by Using Electron Beam Exposure of Kodak Photoresist Films," *Zeit. f. Licht-und Elektroninoptik*, Vol. 25, No. 5, 1967, p. 31; and Matta, "High Resolution Electron Beam Exposure of Photoresists," *Electrochemical Technology*, Vol. 5, No. 7–8, July-August 1967, pp. 382–385.

None of these prior workers have made any effort to alter conventional photoresist compositions, although it is significant to note that Thornley et al. appreciated the problems which they pose: "For serial exposures, such as may be required in printed circuit generators, the maximum exposure rates are limited by the sensitivites of presently available resists." (Thornley et al., op cit, p. 1151).

While prior workers who have studied electron beam development of resists to generate small patterns have worked only with the available resists, workers in the field of photolithography, where photoresists were first employed, have proposed literally thousands of compounds as photopolymerization initiators, catalyzers and sensitizers. The end in view was generally to increase the sensitivity or resolution of the photoresist to light of a particular wavelength. This work is not readily summarized, but the following U.S. patents are considered representative: U.S. Pat. Nos. 2,816,091; 2,831,768; 2,861,057; 3,168,404; 3,178,283; 3,257,664; and 3,331,761.

OBJECTS OF THE INVENTION

A general object of the present invention is to provide new and improved additives to negative photoresists which increase the sensitivity thereof to electrons.

A further object of the present invention is to provide additives to standard negative photoresists which result in increased reactivity of the photoresist itself.

Another object of the present invention is to improve the sensitivity of a standard negative photoresist by including novel additives therein.

A further object of the present invention is to reduce the flux density and, hence, the exposure time required to fully expose a standard photoresist, by incorporating novel additives therein.

Various other objects and advantages of the invention will become clear from the following detailed description of several embodiments thereof, and the novel features of the invention will be particularly pointed out in connection with the appended claims.

THE DRAWINGS

Figure 2:
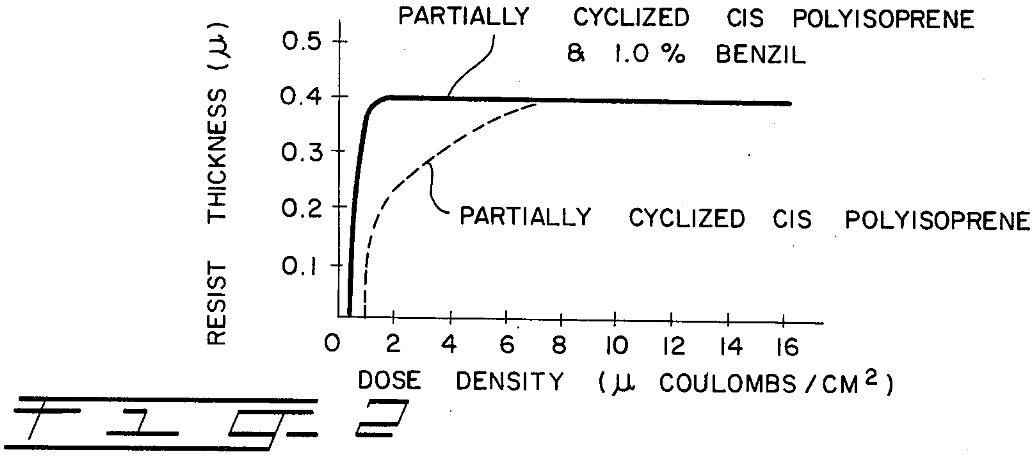
Figure 3:
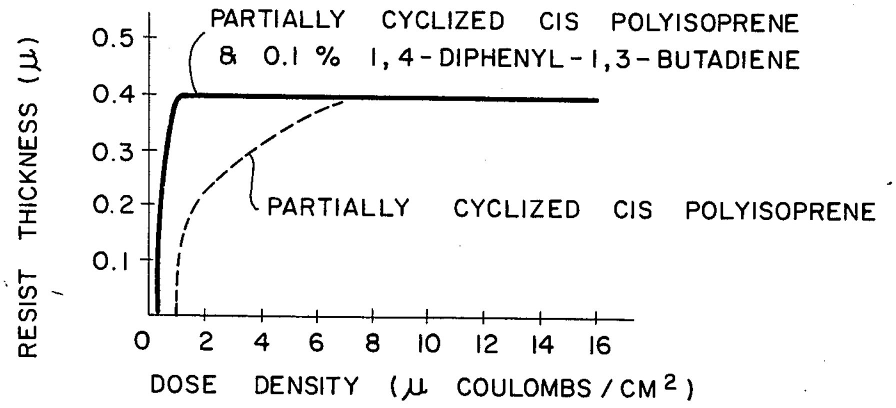

FIGS. 1–3 are plots of resist thickness vs. flux density for exposure of 6,000A films of partially cyclized cis-polyisoprene and partially cyclized cis-polyisoprene plus the preferred additives of the invention.

SUMMARY AND DESCRIPTION OF EMBODIMENTS

In essence, the present invention comprises the addition, to a resist-solvent solution (polyvinyl cinnamate photoresist-solvent solution or partially cyclized cis-polyisoprene photoresist-solvent solution), in small amounts, of compounds which readily dissociate into free radicals. These enhance the crosslinking of the polyvinyl cinnamate and the partially cyclized cis-polyisoprene, thus insolubilizing them. There are many compounds which will do this, but most have undesirable side effects, such as causing crosslinking in the dark, without any exposure. Many peroxides and hydroperoxides fall into this category. Three compounds have proven effective; they are:

| | |
|---|---|
| benzophenone | $C_6H_5-\overset{O}{\overset{\|\|}{C}}-C_6H_5$ |
| benzil | $C_6H_5-\overset{O}{\overset{\|\|}{C}}-\overset{O}{\overset{\|\|}{C}}-C_6H_5$ |
| 1,4-diphenyl-1,3-butadiene | $C_6H_5-\overset{H}{\overset{\|}{C}}=\overset{H}{\overset{\|}{C}}-\overset{H}{\overset{\|}{C}}=C-C_6H_5$ |

The amount of the additive used is important. If too little additive is present, sufficient free radicals will not be generated to cause a maximum effect. On the other hand, if too much of the additive is present, the free radicals will react with each other rather than with the resist, and crosslinking will not be aided. It has been determined that no more than about 5% (all percentages are weight percent) of the additive should be added to either the polyvinyl cinnamate resist-solvent mixture, or the partially cyclized cis-polyisoprene resist-solvent mixture. It should be understood, however, that this may amount to 20% or even 50% of the respective resist after the solvent is removed. Generally, a 1% solution of the additive is preferred.

If one knows the average molecular weight of the photoresist film and the electron accelerating potential, and makes certain assumptions regarding electron penetration, scatter and energy transfer, the gel dose of energy can be calculated from theory (the gel dose is the electron flux necessary to record an image in the film surface, i.e., the minimum dose to cause insolubility). Experimental results are in fair agreement with such calculations. When an additive causes a large number of free radicals to be formed at each collision of an electron with a molecule, then it is not unreasonable to expect that the number of molecules crosslinked at each such energy transfer site will be higher. The problem, as noted above, is to add compounds that will not react spontaneously. While increased crosslinking could be expected with proper additive selection, the magnitude of improvement achieved with the above-noted compounds is quite remarkable. In particular, a five-fold reduction in the dose density required to fully expose a 4,000A film is achieved. The improvement is not linear; the gel dose is reduced little if at all by using the additives. These facts are all clear in the following specific examples.

A further requirement of the additive is that it be soluble in the solvent system employed with the particular resist. The three noted compounds satisfy this requirement.

Both polyvinyl cinnamate and partially cyclized cis-polyisoprene are dissolved in a solvent thereof. With the latter, a thinner may also be employed; this acts merely to reduce viscosity and produce a thinner film. The solvent system used for polyvinyl cinnamate is 86–87% chlorobenzene and 13–14% cyclohexanone. The partially cyclized cis-polyisoprene solvent system is 12% ethylbenzene, 82% mixed xylenes and 6% methylcellosolve. Both systems also contain a sensitizer; in partially cyclized cis-polyisoprene (commercially available as KTFR) this is believed to be 2, 6 bis (p-azidobenzilidene)4-methylcyclohexanone. The partially cyclized cis-polyisoprene thinner is primarily mixed xylenes.

EXAMPLE I

To establish a basis for comparison, tests were first made with polyvinyl cinnamate photoresists without any additives. A polyvinyl cinnamate resist-solvent solution was applied to a chromium-coated glass plate. The resist-solvent solution was commercially obtained and comprised polyvinyl cinnamate (N.A.M.W. of 180,000 to 230,000; W.A.M.W. of 315,000 to 350,000) dissolved in 86–87% chlorobenzene, and 13–14% cyclohexanone. The coated glass plate was then spun so that the resulting coating, after baking at 150°C for 10 minutes, was 6,000A thick. The coated plate was then placed in a vacuum chamber and radiated with electrons accelerated at 15 KV. The plate was developed with a polyvinyl cinnamate developer, commercially obtained, and baked at 150°C for 10 minutes. The following results were obtained:

*a.* Flux needed to record an image (gel dose) = $1.1 \times 10^{-6}$ coul/cm².

*b.* Flux needed to form 3,000A thick resist layer = $6 \times 10^{-6}$ coul/cm².

*c.* Flux needed to form maximum thickness (after development, 4,000A) resist = $10 \times 10^{-6}$ coul/cm².

EXAMPLE II

To establish a basis for comparison, tests were first made with partially cyclized cis-polyisoprene photoresist without any additives. A partially cyclized cis-polyisoprene photoresist-solvent solution was mixed with a thinner (mixed xylenes) in a 1 to 3 ratio. The resist-solvent solution was commercially obtained and comprised partially cyclized cis-polyisoprene (averaging one double bond per 10 carbon atoms; N.A.M.W. of 65,000 ± 5,000; W.A.M.W. of about 120,000) dissolved in 12% ethylbenzene, 82% mixed xylenes and 6% methylcellosolve. The mixture was applied to a chromium-coated glass plate (or, alternatively, to a silicon slice onto which a 18,000A $SiO_2$ layer had been grown), and then spun to a thickness of 8,000A. After baking at 150°C for 10 minutes, the film was 6,000A thick. The coated plates were then put into a vacuum chamber and radiated with 15 KV electrons. The plate was developed with a partially cyclized cis-polyisoprene developer, commercially obtained, and a partially cyclized cis-polyisoprene rinse, commercially obtained, and baked at 150°C for 10 minutes. The following results were found:

*a.* Flux needed to record image (gel dose) = $0.9 \times 10^{-6}$ coul/cm$^2$.

*b.* Flux needed to form 3,000A film = $4 \times 10^{-6}$ coul/cm$^2$.

*c.* Flux needed to form maximum (4,000A) thickness = $7.5 \times 10^{-6}$ coul/cm$^2$.

Under identical conditions, but with 5 KV electrons, the dose densities required to expose partially cyclized cis-polyisoprene films were:

*a.* $0.5 \times 10^{-6}$ coul/cm$^2$

*b.* $0.75 \times 10^{-6}$ coul/cm$^2$

*c.* $2 \times 10^{-6}$ coul/cm$^2$.

EXAMPLE III

The procedure of Example I was repeated except that a 5 weight percent solution of benzophenone in the polyvinyl cinnamate resist-solvent solution was prepared and employed. The three tests noted in Example I were carried out (with 15 KV electrons). The results were as follows:

*a.* $1.0 \times 10^{-6}$ coul/cm$^2$

*b.* $1.5 \times 10^{-6}$ coul/cm$^2$

*c.* $2.0 \times 10^{-6}$ coul/cm$^2$.

EXAMPLE IV

The procedure of Example II was repeated except that a 1 weight percent solution of benzophenone in the thinned (1 to 3) partially cyclized cis-polyisoprene photoresist-solvent solution was prepared and employed. Dose densities for the three tests with 15 KV electrons were as follows:

*a.* $0.5 \times 10^{-6}$ coul/cm$^2$

*b.* $1.0 \times 10^{-6}$ coul/cm$^2$

*c.* $1.75 \times 10^{-6}$ coul/cm$^2$.

The improvement achieved by this additive is graphically illustrated in FIG. 1.

If 5 KV electrons are used instead of 15 KV electrons, results for the three tests are as follows:

*a.* $0.45 \times 10^{-6}$ coul/cm$^2$

*b.* $0.5 \times 10^{-6}$ coul/cm$^2$

*c.* $0.75 \times 10^{-6}$ coul/cm$^2$.

Reasons for the higher efficiency of lower-energy electrons, and reasons for preferring 15 KV beams, are discussed below.

EXAMPLE V

The procedure of Example II was repeated except that a one weight percent solution of benzil in the thinned partially cyclized cis-polyisoprene resist-solvent solution was prepared and employed. Results of the three tests are as follows:

*a.* $0.5 \times 10^{-6}$ coul/cm$^2$

*b.* $1.0 \times 10^{-6}$ coul/cm$^2$

*c.* $1.5 \times 10^{-6}$ coul/cm$^2$.

The improvement achieved with this additive is graphically illustrated in FIG. 2.

EXAMPLE VI

The procedure of Example II was repeated except that a 0.1 weight percent solution of 1,4-diphenyl-1,3 butadiene in the thinned partially cyclized cis-polyisoprene photoresist-solvent solution was prepared and employed. Dose densities for the three tests were as follows:

*a.* $0.5 \times 10^{-6}$ coul/cm$^2$

*b.* $1.5 \times 10^{-6}$ coul/cm$^2$

*c.* $1.5 \times 10^{-6}$ coul/cm$^2$.

The improvement achieved with this additive is illustrated in FIG. 3.

The magnitude of improvement brought about by each of the additives is readily seen in Table I, where the percent reduction in dose for each of the three levels, as compared to the photoresist without any additives, is set forth.

TABLE I

| Example | Reduction in Dose, Pct. (a) Gel Dose | (b) 3,000A | (c) 4,000A |
|---|---|---|---|
| III | 9.1 | 75 | 80 |
| IV | 45 | 75 | 70 |
| V | 45 | 75 | 73 |
| VI | 45 | 63 | 73 |

It will be noted that one of the effects of the additives of the present invention is to increase the slope of the plot of resist thickness vs. dose density to near infinity near the gel point (see FIGS. 1–3). By using the minimum dose density needed to achieve the desired thickness, back-scattered electrons or scattered primary electrons are minimized if not eliminated, and resolution capability of the resist is correspondingly increased. Under these conditions, an edge definition of about 300A can be expected as an upper limit. This is significantly better than previously reported definition.

It will be further noted by comparing the partially cyclized cis-polyisoprene radiated with 5 and 15 KV electrons, that the 5 KV samples required less energy at all three stages. It is quite true, in fact, that lower energy electrons act much more efficiently than higher energy electrons; on the average, about 2.5 times the number of molecules at each energy transfer point will react at 5 KV than will at 15 KF. It would seem appropriate, then, to utilize lower energy electrons, but control of the size of the beam is more difficult at low energies. If very high potentials are used (+20 KV) the efficiency of crosslinking drops too low and back-scatter can become a significant problem. For these reasons, a 15 KV accelerating potential is preferred.

It is to be understood that various changes in the details, steps, materials and arrangements of parts, which have been herein described and illustrated in order to explain the nature of the invention, may be made by those skilled in the art within the principle and scope of the invention as defined in the appended claims and their equivalents.

What is claimed is:

1. A process for generating a pattern on a substrate comprising:

coating said substrate with a uniform thin film of a composition comprising (a) a partially cyclized cis-polyisoprene and a solvent therefor, and (b) 1,4-diphenyl-1,3-butadiene, present in an amount ranging from 0.1 to 5% of said partially cyclized cis-polyisoprene and solvent;

exposing areas of said substrate desired to be protected to sufficient electron beam radiation to crosslink and insolubilize the thin film on said areas;

dissolving and removing the areas of said thin film not radiated; and etching, plating or oxidizing the now-exposed portions of said substrate.

2. The process as claimed in claim 1, wherein said 1,4-diphenyl-1,3-butadiene and said partially cyclized cis-polyisoprene are initially dissolved in said solvent, spread on said substrate and dried to drive off said solvent.

* * * * *

UNITED STATES PATENT OFFICE

CERTIFICATE OF CORRECTION

Patent No. 3,894,163 Dated July 8, 1975

Inventor(s) Barret Broyde

It is certified that error appears in the above-identified patent and that said Letters Patent are hereby corrected as shown below:

In the specification, Column 1, line 10, "assigned" should read --assignee--. Column 3, equation (4), " 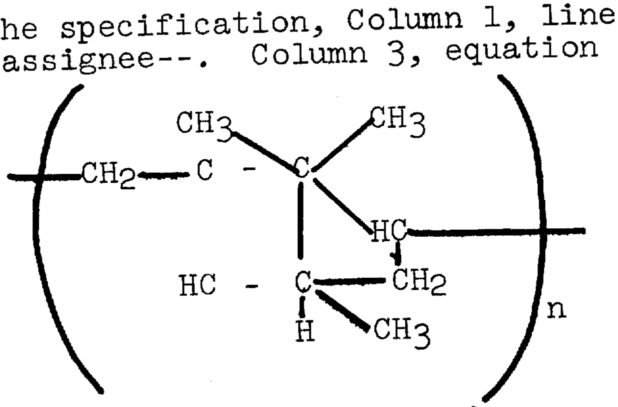 " (4)

should read

-- 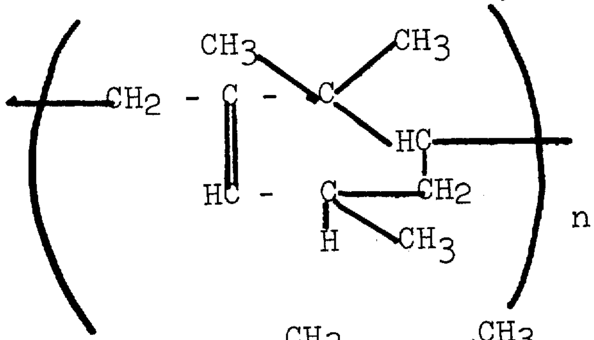 -- (4);

equation (5)

" 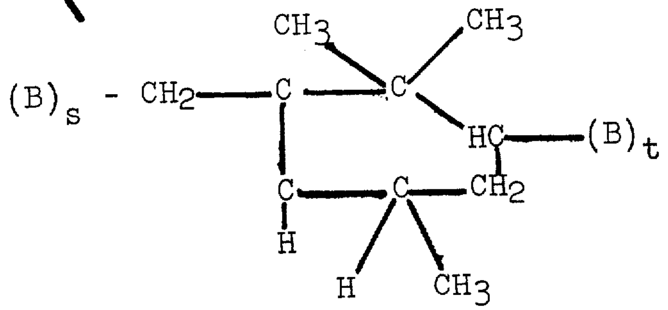 " (5)

UNITED STATES PATENT OFFICE

CERTIFICATE OF CORRECTION

Patent No. 3,894,163 Dated July 8, 1975

Inventor(s) Barret Broyde

It is certified that error appears in the above-identified patent and that said Letters Patent are hereby corrected as shown below:

should read

-- 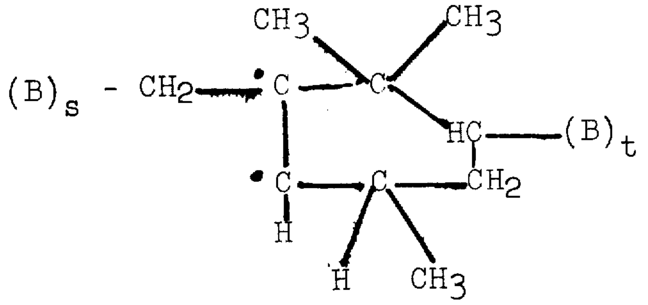 --

(5);

lines 61-62," underlying" should read --underlying,--. Column 4, line 23, "Microelectronics,"" " should read --Microelectronics,"--. Column 8, line 43, "15KF" should read --15 KV--.

Signed and Sealed this

Ninth Day of November 1976

[SEAL]

Attest:

RUTH C. MASON
*Attesting Officer*

C. MARSHALL DANN
*Commissioner of Patents and Trademarks*